United States Patent
Norell

(10) Patent No.: US 8,054,080 B2
(45) Date of Patent: Nov. 8, 2011

(54) CLOSURE AND SYSTEM FOR NMR SAMPLE CONTAINERS

(75) Inventor: Gregory B. Norell, Mays Landing, NJ (US)

(73) Assignee: Norell, Inc., Landisville, NJ (US)

( * ) Notice: Subject to any disclaimer, the term of this patent is extended or adjusted under 35 U.S.C. 154(b) by 208 days.

(21) Appl. No.: 12/269,938

(22) Filed: Nov. 13, 2008

(65) Prior Publication Data

US 2009/0128151 A1  May 21, 2009

Related U.S. Application Data

(60) Provisional application No. 60/988,470, filed on Nov. 16, 2007.

(51) Int. Cl.
*G01V 3/00* (2006.01)
(52) U.S. Cl. ........................................... 324/318
(58) Field of Classification Search .......... 324/300–322; 600/410–435
See application file for complete search history.

(56) References Cited

U.S. PATENT DOCUMENTS

| | | | | |
|---|---|---|---|---|
| 5,344,036 A | * | 9/1994 | Stanescu et al. | 215/251 |
| 5,397,989 A | | 3/1995 | Spraul et al. | |
| 5,517,856 A | * | 5/1996 | Hofmann et al. | 324/321 |
| 5,534,780 A | | 7/1996 | Lilly | |
| 5,831,434 A | * | 11/1998 | Shigezane et al. | 324/321 |
| 5,952,831 A | | 9/1999 | Yamakoshi et al. | |
| 5,977,772 A | * | 11/1999 | Wand et al. | 324/321 |
| 6,362,624 B1 | * | 3/2002 | Wand et al. | 324/321 |
| 6,486,672 B1 | * | 11/2002 | Wand et al. | 324/321 |
| 6,563,317 B2 | | 5/2003 | Warden et al. | |
| 6,645,635 B2 | * | 11/2003 | Muraki | 428/422 |
| 6,686,740 B2 | * | 2/2004 | Tschirky et al. | 324/321 |
| 6,741,079 B2 | * | 5/2004 | Hofmann et al. | 324/321 |
| 6,812,706 B2 | * | 11/2004 | Leung et al. | 324/321 |
| 6,969,993 B2 | | 11/2005 | Tschirky et al. | |
| 7,250,767 B2 | | 7/2007 | Hofmann et al. | |
| 7,728,593 B2 | * | 6/2010 | Norell | 324/321 |

OTHER PUBLICATIONS

PCT International Search Report and Written Opinion for PCT/US08/83496, dated Feb. 4, 2009, 12 pp.

* cited by examiner

*Primary Examiner* — Dixomara Vargas
(74) *Attorney, Agent, or Firm* — Diehl Servilla LLC; Glen M. Diehl

(57) ABSTRACT

A removable closure for closing the open end of an NMR sample tube having an open end and a closed end of the invention includes a cylindrical proximal first and a distal second portion, both portions substantially congruent to a central axis. The second portion has a hollow bore extending therethrough, the hollow bore has three sections: a distal section, a central section and a proximal section. The distal section has an inside diameter sized to accept the outside diameter of a preselected size NMR sample tube substantially without an interference, the central section is sized to provide a compliant interference fit with the outside diameter of the preselected size NMR sample tube, and the proximal section is sized to accept the outside diameter of the preselected size NMR sample tube without interference.

19 Claims, 8 Drawing Sheets

CAP FOR 5mm TUBE

CAP FOR 5mm TUBE

CAP FOR 5mm TUBE

CLOSURE AND SYSTEM FOR NMR SAMPLE CONTAINERS

STATEMENT OF RELATED CASES

This application claims the benefit of priority under 35 U.S.C. §119(e) to U.S. Provisional Patent Application Ser. No. 60/988,470, filed Nov. 16, 2007, the disclosure of which is hereby incorporated by reference in its entirety.

TECHNICAL FIELD

This application is generally related to sample containers for placing a sample for measurement of a property of the sample in an instrument, and more particularly, to closure devices and tubes for a Nuclear Magnetic Resonance (NMR) samples.

BACKGROUND

Nuclear Magnetic Resonance spectrometry is widely used in chemical studies for structure determination as well as presence, absence or concentration of a particular component in a sample. An NMR spectrum of a sample is generally determined by placing the sample in an elongate sample tube, placing the tube containing the sample in the field of a powerful magnet and selectively irradiating the sample with preselected radiofrequency signals and recording the effects of these signals on the sample. The sample tubes are formed from glass and are supplied in several sizes ranging from diameters of 1 mm to about 10 mm with lengths of about four inches to about seven inches long. The resolution of the spectrometer may be adversely affected by asymmetries in the sample tube and its placement within the magnetic field and irradiation coils. Accordingly, users of NMR spectrometers seek sample tubes and holders that minimize asymmetry.

In an effort to "average-out" sample asymmetry, some spectrometers axially spin samples on which the spectrum is being determined. More recently, NMR spectrometers have the capability to average-out some sample asymmetry electronically without spinning, but sample placement and positioning in the sample chamber is still important to optimize the resolution of the spectrometer. These more recent NMR spectrometers also utilize the tube closure to suspend the sample axially in the sample chamber. Thus, tube closures or caps need to do more than just close the tube. When the samples are not spun, the coaxiality of the outer diameter, the closure and the inside diameter of the tube, if not consistent and precise, may adversely effect the quality of the spectrum obtained.

In many cases, the materials whose NMR spectrum is being determined are derived from expensive and difficult to repeat studies. Accordingly, if a sample is lost or degraded because of a malfunction of the sample closure or the tube, the user may experience a substantial and expensive delay in their study. Thus, although there are many types of NMR sample systems and tube closure devices available, there is still a need for an NMR sample system and closure which is reliable, simple to use and allows the user of an NMR spectrometer to fully utilize the resolution capability of the spectrometer. If such a device also was compatible with available automated sample handling equipment, a further benefit to the art of NMR spectrum determination would be realized. Such a system and closure is disclosed herein.

SUMMARY

A selectively removable closure for closing the open end of an NMR sample tube having an open end and a closed end includes a cylindrical proximal first and a distal second portion, both portions being substantially congruent to a central axis thereof. The second portion has a hollow bore extending therethrough. The hollow bore has three sections: a distal section; a central section; and a proximal section. The distal section has an inside diameter sized to accept the outside diameter of a preselected size NMR sample tube substantially without an interference. The central section is sized to provide a compliant interference fit with the outside diameter of the preselected size NMR sample tube. The proximal section is sized to accept the outside diameter of the preselected size NMR sample tube without interference, so that as the open end of the NMR sample tube is proximally axially inserted into the closure, the distal section guides the tube into the closure, the central section interference fit provides a user perceptible resilient resistance to the axial passage of the tube and the movement of the tube open end into the proximal section allows the user to perceive a lessened resistance of the movement of the tube followed by seating the tube open end substantially adjacent to the first portion of the closure.

A method for manufacturing a closure includes selecting a polymeric material in the form of an elongate cylinder; placing the elongate cylinder of the polymeric material in a lathe; shaping the elongate cylinder into a closure having a cylindrical proximal first and a distal second portion, both portions being substantially congruent to a central axis thereof, the second portion having a hollow bore extending therethrough, the hollow bore having a distal section, a central section and a proximal section, the distal section having an inside diameter sized to accept the outside diameter of a preselected size NMR sample tube substantially without an interference, the central section sized to provide a compliant interference fit with the outside diameter of the preselected size NMR sample tube, and the proximal section sized to accept the outside diameter of the preselected size NMR sample tube without interference; and removing the finished closure from the lathe.

A method for determining the NMR spectrum of a material includes placing an aliquot of a suitable solvent containing a sufficient amount of a material of which an NMR spectrum is to be determined in a preselected size NMR sample tube having an open end and a closed end defining a cavity for receiving the aliquot; applying a closure to the open end of the NMR tube, the closure having a cylindrical proximal first and a distal second portion, both portions being substantially congruent to a central axis thereof, the second portion having a hollow bore extending therethrough, the hollow bore having a distal section, a central section and a proximal section, the distal section having an inside diameter sized to accept the outside diameter of the preselected size NMR sample tube substantially without an interference, the central section sized to provide a compliant interference fit with the outside diameter of the preselected size NMR sample tube, and the proximal section sized to accept the outside diameter of the preselected size NMR sample tube without interference so that the open end of tube is disposed adjacent to the first portion of the closure; grasping the closure picking up the sample tube having the material therein; placing the closed sample tube into a sample cavity of an NMR spectrometer; and operating the NMR spectrometer to determine the spectrum of the material.

The closure and sample tube system of the invention provides users of NMR spectrometers with a selectively removable closure for NMR sample tubes which is easily and securely placed on the tube. The closure of the invention maintains a seal, even if the open end of the tube is chipped or not square, because it does not depend on the extreme top of the tube for the retention and seal of the tube. In some embodiments, the system of the invention incorporates the closure of the invention cooperatively sealingly engaging an area of reduced outside diameter of the tube. In substantially all of the embodiments, the closure of the invention enables the user to grasp the cap for picking up and placing the tube without worrying that the cap may separate from the tube and cause the sample to be lost. Additionally, some embodiments of the closure and sample tube system of the invention may be utilized with various available auto sampling systems.

Before describing several exemplary embodiments of the invention, it is to be understood that the invention is not limited to the details of construction or process steps set forth in the following description. The invention is capable of other embodiments and of being practiced or being carried out in various ways.

DETAILED DESCRIPTION

Reference throughout this specification to "one embodiment," "certain embodiments," "one or more embodiments" or "an embodiment", means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment", in various places throughout this specification are not necessarily referring to the same embodiment of the invention. Furthermore, the particular features, structures, materials, or characteristics may be combined in any suitable manner in one or more embodiments. In this description, the term "proximal" refers to the direction away from the closed end of the sample tube and the term "distal" refers to the direction toward the closed end of the sample tube.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. In particular, those skilled in the art will know how to make appropriate changes to the dimensions of the below-described closure consistent with the invention and needs of the user. Thus, it is intended that the present invention include modifications and variations that are within the scope of the appended claims and their equivalents.

Figure 1:
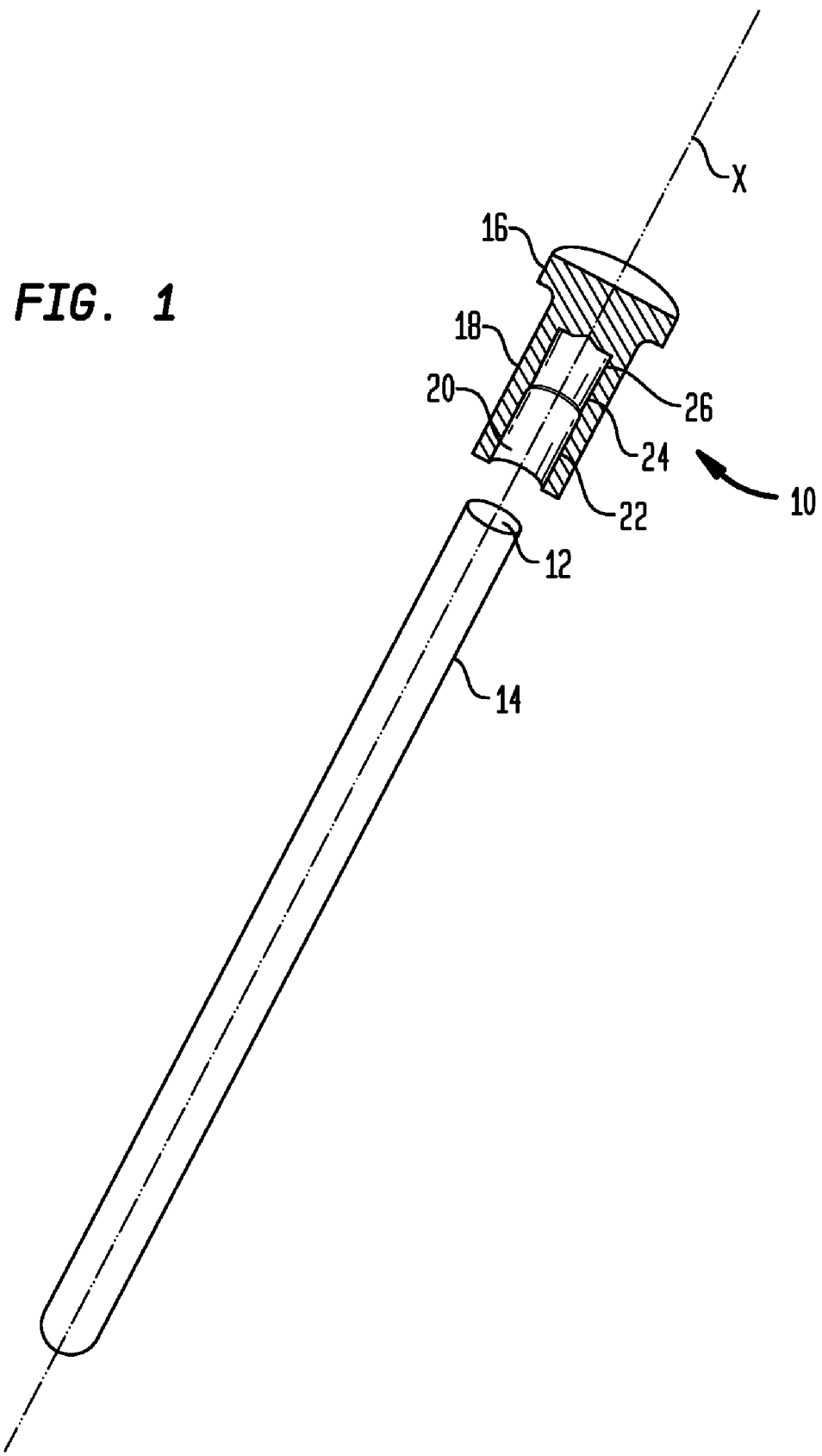
FIG. 1 is an exploded partial cross-sectional perspective view of one embodiment of the closure of the invention with an NMR sample tube.
Figure 2:
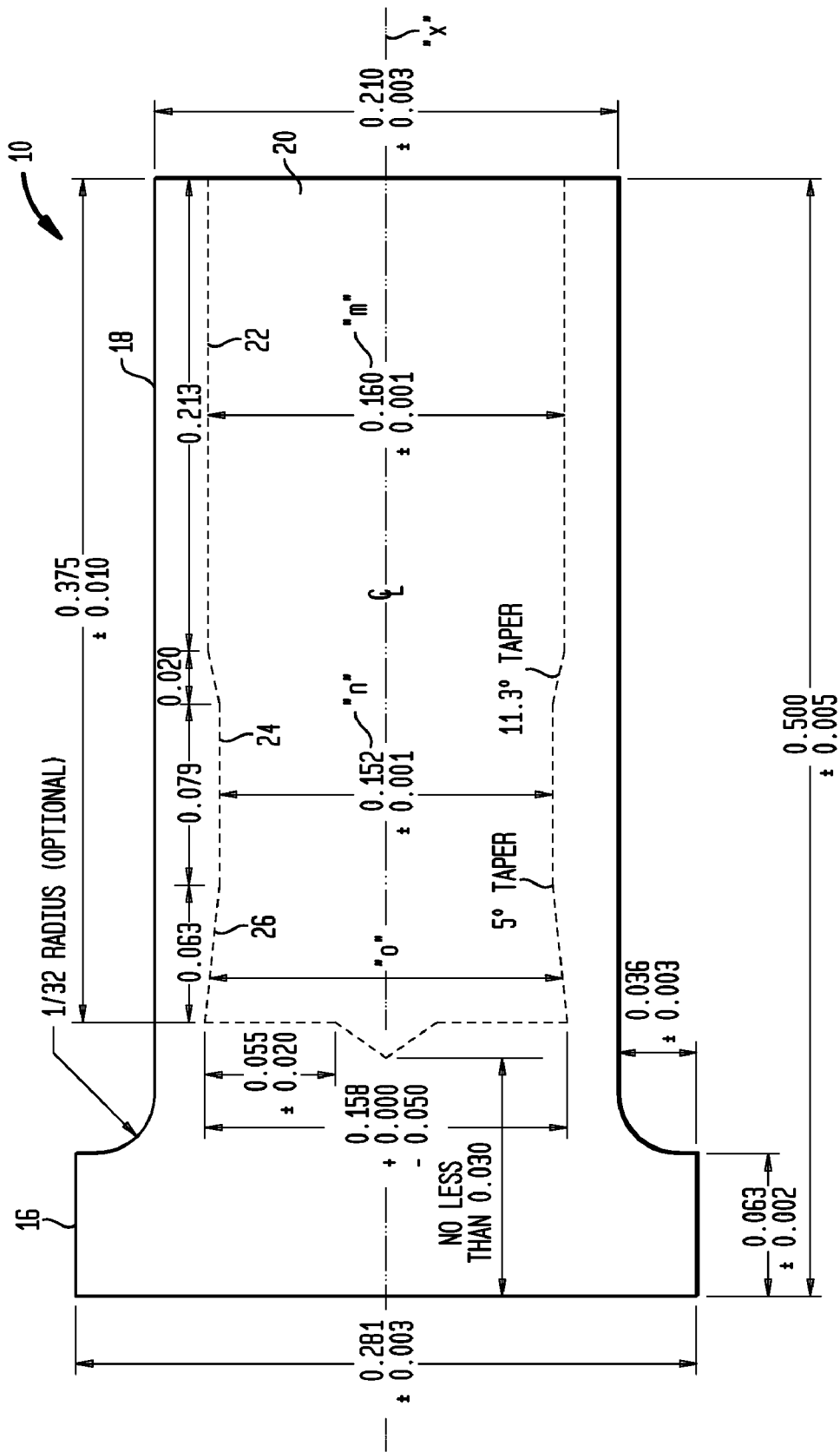
FIG. 2 is a cross-sectional view of an embodiment of the closure of the invention with dimensions appropriate for an NMR tube having a nominal 4 mm outside diameter.
Figure 3:
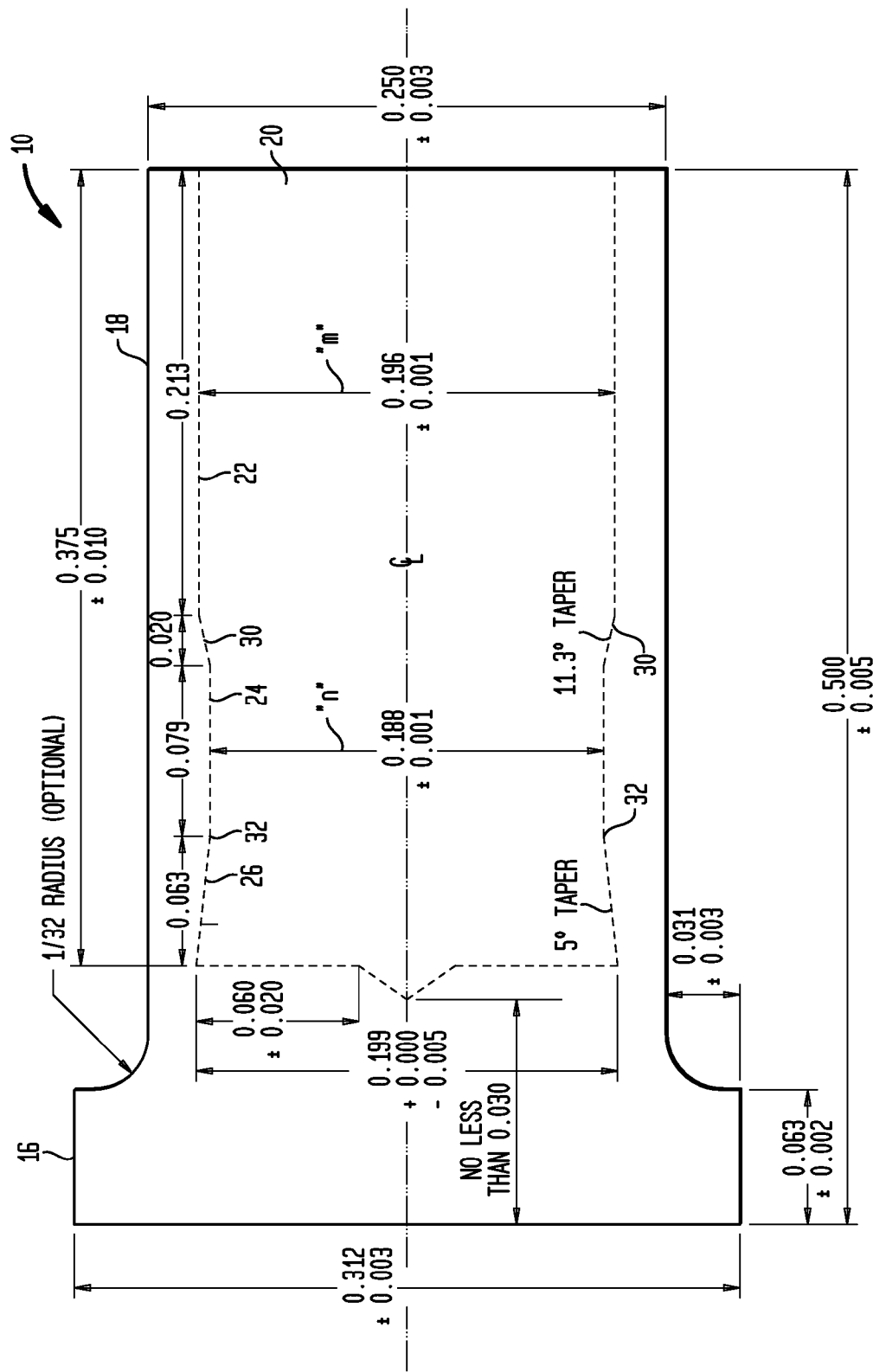
FIG. 3 is a cross-sectional view of an embodiment of the closure of the invention with dimensions appropriate for an NMR tube having a nominal 5 mm outside diameter.

Referring to FIGS. 1, 2 and 3, in one embodiment, a selectively removable closure 10 for closing an open end 12 of an NMR sample tube 14 includes a cylindrical proximal first portion 16 and a distal second portion 18. Both portions 16 and 18 are substantially congruent to a central axis "X". Second portion 18 has a hollow bore 20 extending therethrough. Hollow bore 20 has three sections, a distal section 22, a central section 24 and a proximal section 26. Distal section 22 has an inside diameter m, best seen in FIG. 3, that is sized to accept the outside diameter of a preselected size NMR sample tube substantially without an interference, e.g., when a 5 mm tube is selected, having an O.D. of about 4.95±0.013 mm, I.D. "m" is about 4.98±0.025 mm. Central section 24 is sized to provide a compliant interference fit with the outside diameter of the preselected NMR sample tube, e.g., for a 5 mm tube having an O.D. of about 4.95±0.013 mm, I.D. "n" is about 4.77±0.025 mm. Proximal section 26 is sized to accept the outside diameter of the preselected NMR sample tube, e.g. for a 5 mm tube having an O.D. of about 4.95±0.013 mm, I.D. "o" is about 5 mm. By having the several I.D. dimensions of sections 22, 24 and 26 as described above, when open end 12 of sample tube 14 is proximally axially inserted into closure 10, distal section 22 guides tube 14 into the closure, central section 24 provides a user perceptible resistance to passage of tube 14 and the movement of the tube into proximal section 26 allows the user to perceive a lessened resistance to the movement of the tube followed by seating open end 12 substantially adjacent first portion 16.

In some embodiments, second portion hollow bore central section 24 has an inside diameter sized to have an interference fit of between about 2% and about 8% relative to the outside diameter of NMR sample tube 14 when closure 10 is placed on open end 12 of the tube. Other interference fits which do not damage the sample tube can be used consistent with the invention. This interference fit serves to align tube 14 substantially coaxially with axis "X" of closure 10 and substantially optimally position the tube in the NMR sample chamber when closure 10 is being used to suspend the tube in the sample chamber.

In one embodiment, shown in FIG. 3, where closure 10 is sized for the 5 mm tube, a transition between distal section 22 and central section 24 of hollow bore 20 is a ramp 30 with a slope of between about 5° to about 15° relative to the distal section. In this embodiment, the transition 32 between central section 24 and proximal section 26 has a slope of between about −2° to about −5° relative to central section 24. Again, other transition dimensions which provide appropriate interference without damaging the sample tube can be used consistent with the invention. Yet other values for the transitions and the amount of interference fit may also be advantageously used for embodiments related to FIG. 8.

Figure 4:
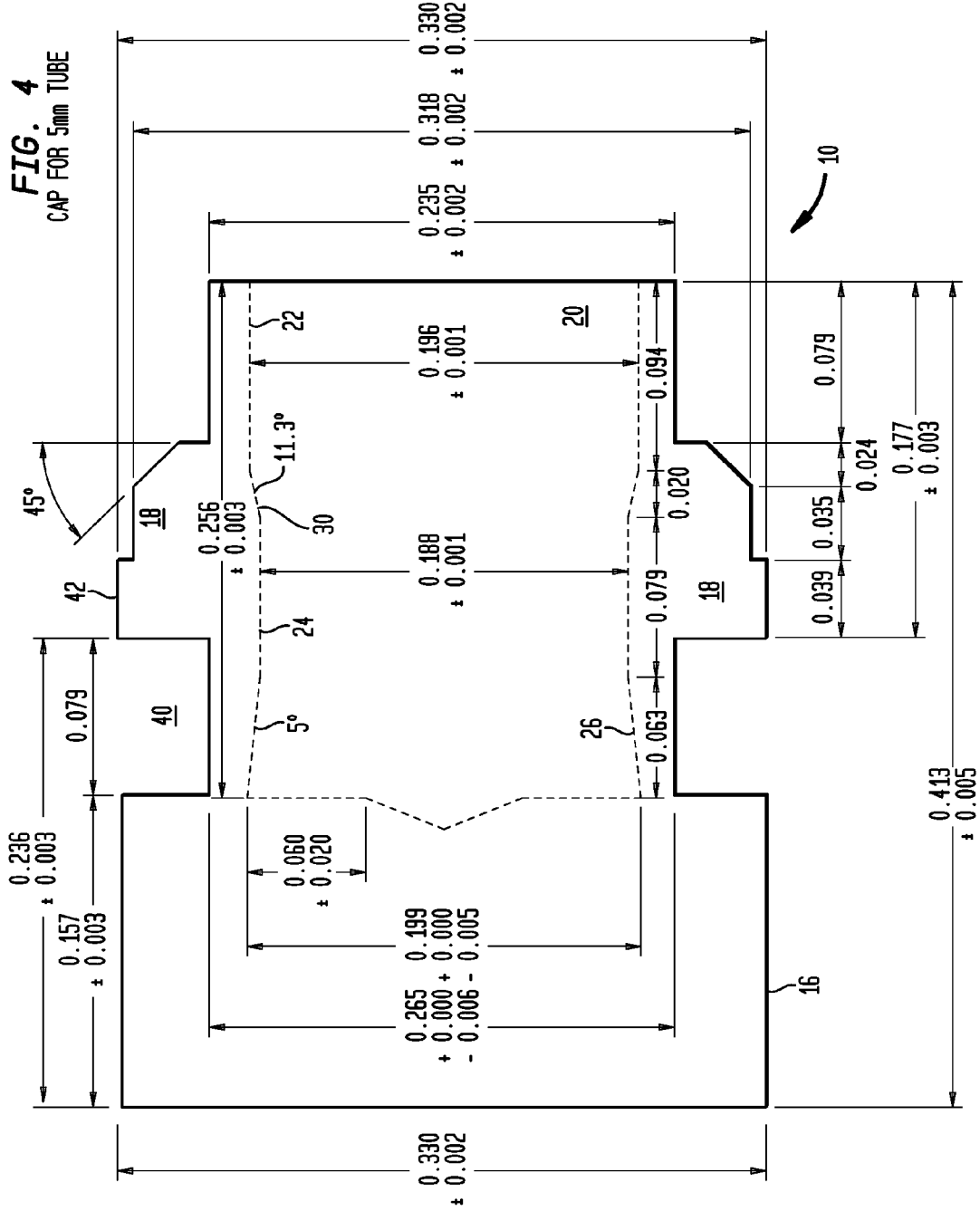
FIG. 4 is a cross-sectional view of another embodiment of the closure of the invention with dimensions appropriate for an NMR tube having a nominal 5 mm outside diameter.
Figure 5:
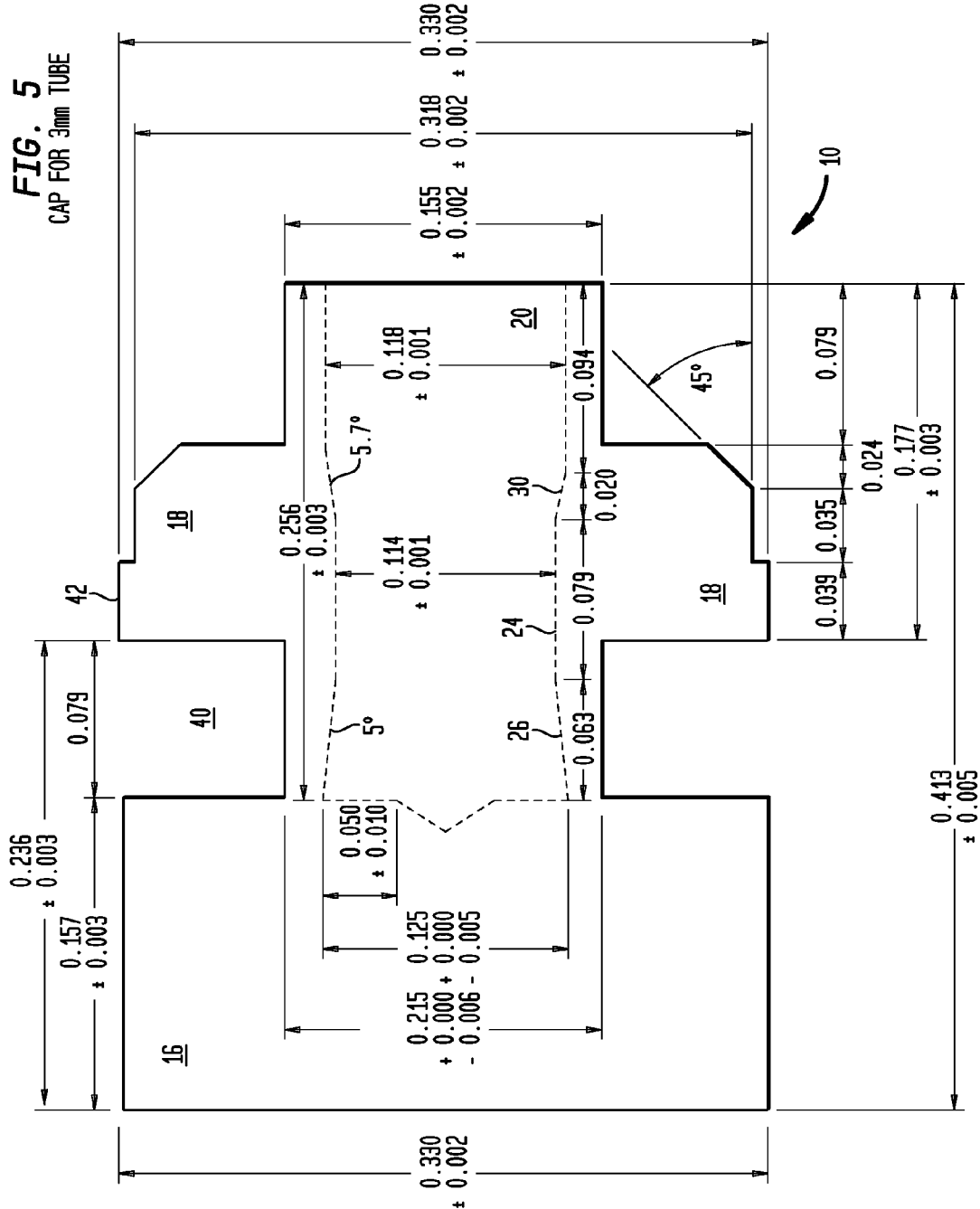
FIG. 5 is a cross-sectional view of another embodiment of the closure of the invention with dimensions appropriate for an NMR tube having a nominal 3 mm outside diameter.

In the embodiment illustrated in FIG. 3, first portion 16 has a larger outside diameter than second portion 18. In other embodiments, illustrated in FIGS. 4 and 5, first portion 16 and second portion 18 may have substantially the same outside diameters, with an additional structural feature such as one or more annular grooves 40 disposed substantially symmetrically to axis "X" along the outside diameter of closure 10. The distal second portion 18 of FIG. 4 has an expanded outside diameter portion 42.

Figure 6:
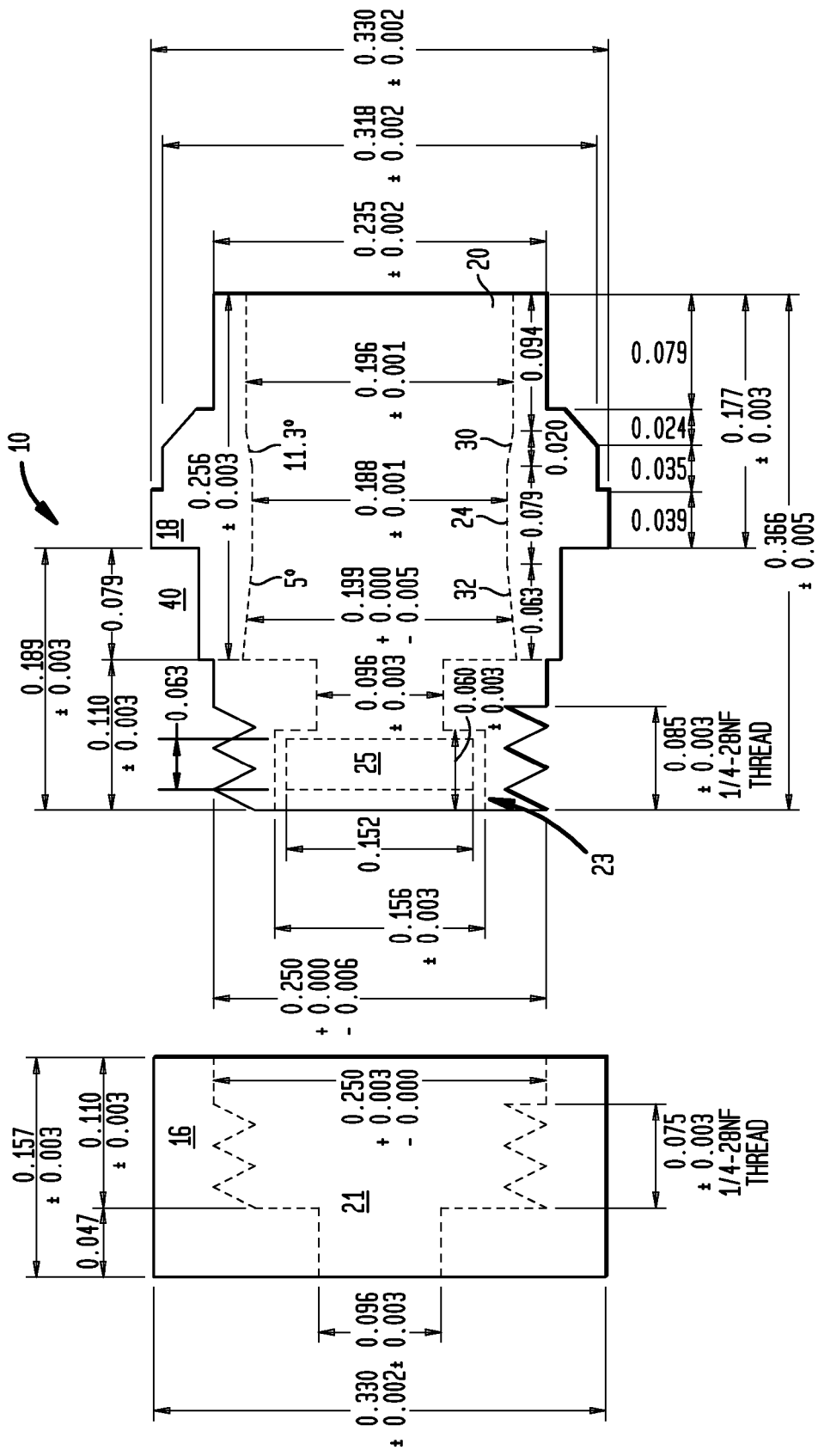
FIG. 6 is an exploded cross-sectional view of another embodiment of the closure of the invention with dimensions appropriate for an NMR tube having a nominal 5 mm outside diameter.

Referring to FIG. 6, in another embodiment of closure 10, first portion 16 and second portion 18 may have substantially the same outside diameters, but are individually formed as separate articles of manufacture. In this embodiment, first portion 16 has a hollow passage 21 therethrough disposed substantially coaxially with the "X" axis of closure 10 and is fluidly communicative with hollow bore 20 of the second portion when the first portion is attached to the second portion. In this embodiment, the attachment of first portion 16 to second portion 18 may be by cooperating threads, snap fit, press fit, adhesive bonding, solvent bonding, heat bonding, spin welding, sonic welding or other forms of forming releasable or fixed attachments as may be suitable for particular materials used to form the portions of closure 10. Additionally, as is shown in FIG. 6, there may be an enlargement 23 in either hollow passage 21, hollow bore 20, or partially in both passage 21 or bore 20 for accommodating a septum 25 formed from a resilient material that would occlude passage 21 and hollow bore 20, while allowing materials to be added or withdrawn from sample tube 14 by penetration of septum 25 by a penetrating element such as a syringe needle or an automated delivery device. Septum 25 is shown both adjacent to closure 10 and in phantom in enlargement 23. Suitable resilient materials for forming septum 25 include, but are not limited to, natural or synthetic rubber, silicone rubber, or the like, which will substantially reseal after a penetration. In some embodiments, septum 25 may include a slit, (not shown) to facilitate passage and withdrawal of the penetrating element. In this embodiment, the outside dimensions of first portion 16 and second portion 18 are constructed so as to produce groove 40 substantially symmetrically about axis "X" when the first and second portions are attached.

Figure 7:
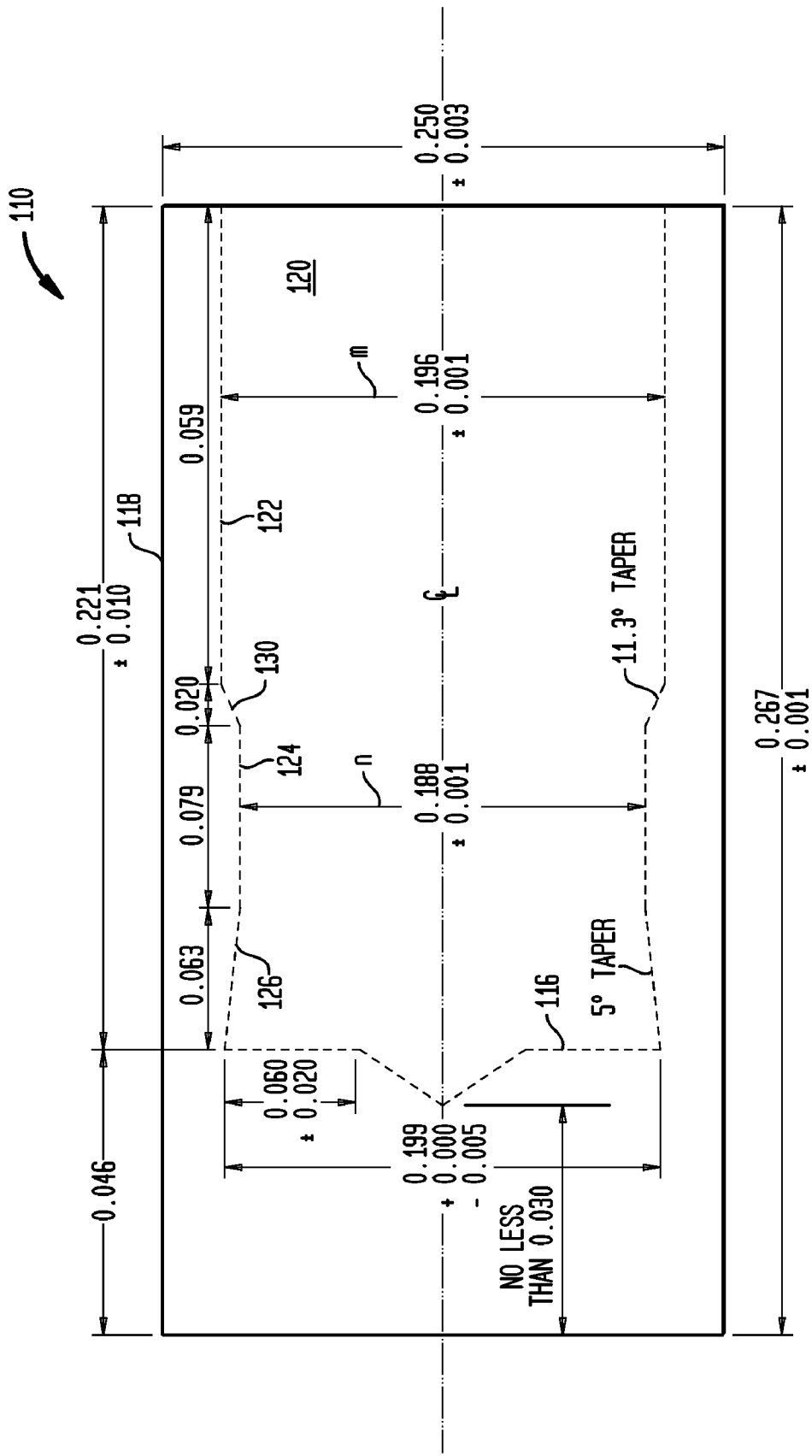
FIG. 7 is a cross-sectional view of another embodiment of the closure of the invention with dimensions appropriate for an NMR tube having a nominal 5 mm outside diameter.

FIG. 7 illustrates an embodiment of the closure of the invention that is dimensioned for compatibility with a robotic sampling device that utilizes a clamp mechanism that surrounds the cap, grasps it and then utilizes the cap to pick and place the tube. This embodiment, elements having similar structure and function of closure 10 in the embodiments illustration has reference numbers similar to those of FIGS. 1-6 except in the 100 series. Closure 110 has a proximal first portion 116 and a distal second portion 118. Closure 110 of the invention has a substantially uniform outside diameter over its length with a hollow bore 120 therethrough. Closure 110 has a distal section 122 with substantially no interference with the outside diameter of the preselected size tube. A ramp 130 connects distal section 122 to central section 124. Central section 124 has a similar interference fit to that of the embodiments described above and proximal section 126 provides the user with a perceptible reduced resistance movement for the tube to be seated substantially adjacent proximal first portion 116.

Figure 8:
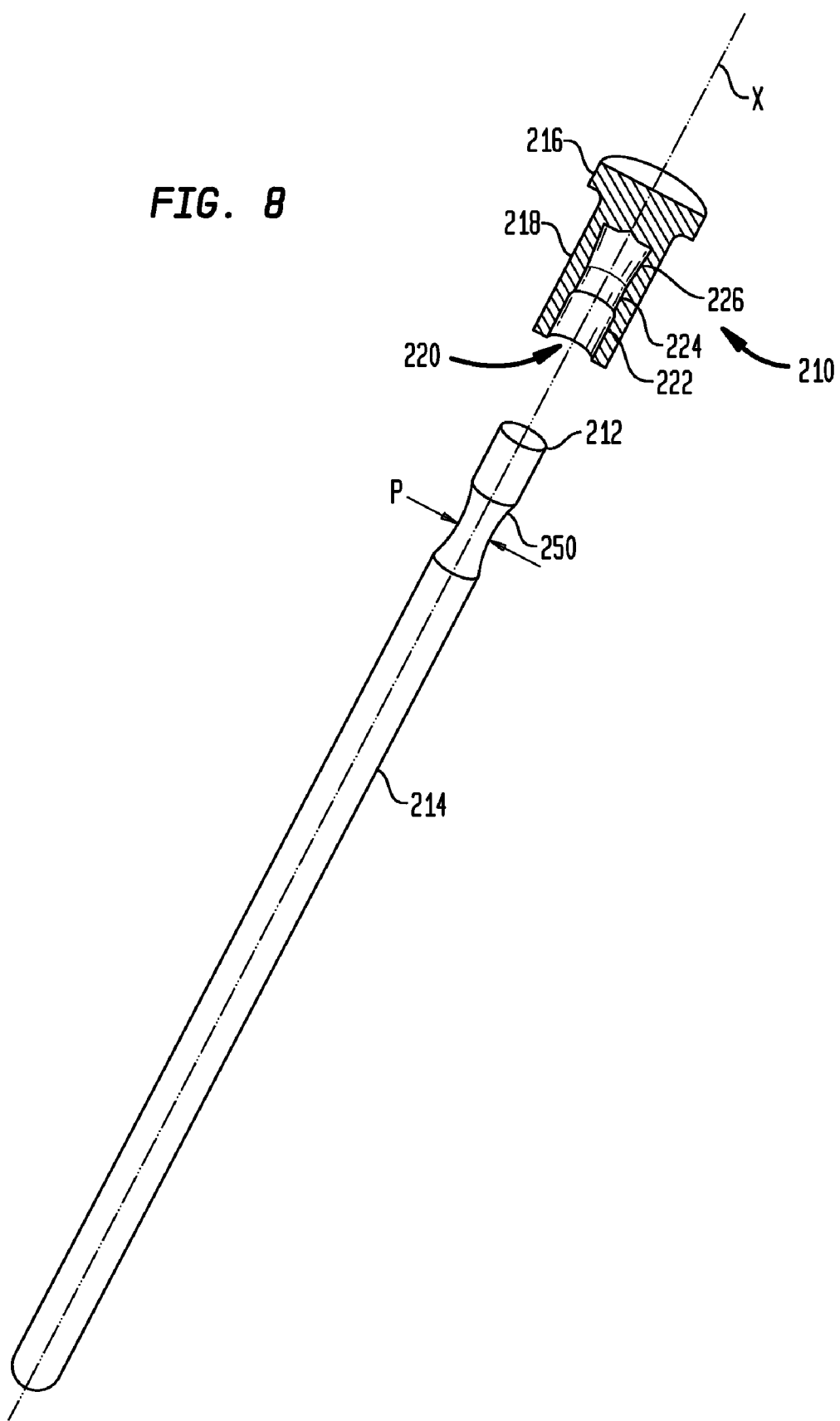
FIG. 8 is an exploded partial cross-sectional view of an embodiment of a sample tube system of the invention.

FIG. 8 illustrates an embodiment of the closure of the invention that cooperatively engages with an NMR sample tube to form a vessel and closure system. In this embodiment, elements having similar structure and function of closure 10 and sample tube 14 in the embodiments illustrated in FIGS. 1-6 are assigned similar reference numbers in the 200 series. A selectively removable closure 210 for closing an open end 212 of an NMR sample tube 214 includes a cylindrical proximal first portion 216 and a distal second portion 218. Both portions 216 and 218 are substantially congruent to a central axis "X". Second portion 218 has a hollow bore 220 extending therethrough. Hollow bore 220 has three sections, a distal section 222, a central section 224 and a proximal section 226. Distal section 222 has an inside diameter m, similar to that shown in FIGS. 1-3 for the closure 10, that is sized to accept the open end outside diameter of a preselected size NMR sample tube substantially without an interference, e.g., when a 5 mm tube is selected, having an O.D. of about 4.95±0.013 mm, I.D. "m" is about 4.98±0.025 mm. In the embodiment shown in FIG. 8, central section 224 is sized to provide a cooperative fit with a reduced outside diameter portion 250 disposed adjacent the open end 212 of an embodiment of preselected NMR sample tube 214 of the invention disposed to cooperate with central section 224 of closure 210 when the closure is fully engaged with sample tube 214 and open end 212 abuts proximal first portion 216 of the closure. In this embodiment, e.g., for a 5 mm tube having an O.D. of about 4.95±0.013 mm, I.D. "n" is about 4.77±0.025 mm, reduced outside diameter portion may have an O.D. "p" of about 4.77±0.025 mm so as to provide a nominal to slight interference fit as the open end of the tube with O.D of about 4.95±0.013 mm leaves the central section 224 and top portion 216.

As described above, reduced O.D. portion 250 of sample tube 214 is positioned to cooperate with central section 224. In order to cooperate with central section 224, a cross-sectional profile of reduced O.D. portion 250 is substantially a mirror image of the profile described for distal section, central section 24, ramp 30 and proximal section 26 in FIGS. 1-3 above. In the embodiments with reduced O.D. portion 250, the presence of the reduced O.D. of tube 214 will provide an interference fit at the lower end of the range expected for the interference fit between central section 24 and the O.D. of tube 14 of FIGS. 1-3 without the reduced O.D. section 250.

Proximal section 226 is sized to accept the outside diameter of the preselected NMR sample tube, e.g. for a 5 mm tube having an O.D. of about 4.95±0.013 mm, I.D. "o" is about 5 mm. By having the several I.D. dimensions of sections 222, 224 and 226 as described above, when open end 212 of sample tube 214 is proximally axially inserted into closure 210, distal section 222 guides tube 214 into the closure, central section 224 provides a user perceptible resistance to passage of tube 214 and the movement of open end 212 of tube 214 into proximal section 226 allows the user to perceive a lessened resistance to the movement of the tube as central section 224 cooperatively enters reduced outside diameter portion 250 of tube 214 followed by seating open end 212 substantially adjacent first portion 216. The particular dimensions and the interference relationships of reduced O.D. portion 250 and central section 224 advantageously may be adjusted for sizes other than the 5 mm tube used as an example. These other embodiments encompassing other dimensioned sample tubes and closures are to be considered within the scope of the present disclosure.

In some embodiments of the closure of the invention, the closure may be formed from a solid rod of a polymeric material such as polytetrafluoroethylene (PTFE) or other substantially chemically inert materials having similar properties. The use of PTFE as a material is facilitated by shaping the rod into the desired dimensions with a computer numerical controlled (CNC) automated lathe apparatus. Once the CNC apparatus is properly set-up, it can repeatedly efficiently produce the closure of the invention with a high degree of accuracy and precision. For other applications, injection molding techniques using other polymeric materials may be utilized, but many polymeric materials suitable for injection molding may not have the same degree of solvent resistance and dimensional stability as PTFE. Additionally, PTFE has sufficient resiliency that the closure will deflect sufficiently at central portion 24 to allow for some variation in NMR tube outside diameter. For example, tubes of European manufacture may have a slightly larger nominal outside diameter for a particular size than tubes manufactured in North America.

NMR tubes typically are formed from a vitreous material, generally various types of glass, e.g., soda-lime, borosilicate, quartz, and the like. In some applications, a polymeric material may also be used. Conventional closures are formed from polymeric materials that are more rigid than PTFE and, since these conventional tubes depend upon contact at the top of the tube to retain the closure onto the tube, the edge of the tube may remove material from the closure as tubes are repeatedly inserted into the closure, which reduces the ability of the closure to be retained on the tube. Closures 10, 110 and 210 of the invention substantially avoid this problem by having a resilient interference fit below the top of the tube and thus are not dependent on the tube end being perfectly formed to seal and retain the tube in the closure.

In the embodiment of the closure and tube system illustrated in FIG. 8, reduced O.D. portion 250 may be incorporated into tube 214 by application of sufficient heat to soften the area where it is desired to position reduced portion 250 while tube 214 is fixtured, thereby causing a narrowing of the tubing. In some embodiments, this procedure may be advantageously conducted before tube 214 is cut to its final length. Alternatively, sufficient heat may be applied to tube 214 while the tube is mounted in a lathe, and a tool, such a heated metal device or a graphite rod or paddle may be applied to the heated tube while it is rotating to achieve the desired shape of reduced O.D. portion 250.

A further benefit of the embodiments of the invention is that nominal four inch tubes designed for use in automated sample handling devices of different manufacturers are actually produced in a separate length for each manufacturer using their specific conventional closures. One manufacturer may supply tubes with closures thereon having an overall length of 105.8±0.5 mm, while another may supply tubes with closures thereon having an overall length of 107.5±0.2 mm. With the embodiments of the closures of the present invention, a standardized overall tube length of 103.5±0.2 mm may be used, with the embodiments of the closure of the present invention providing the compatible overall length for use with current automated handling systems and NMR spectrometers.

What is claimed is:

1. A removable closure for closing open end of an NMR sample tube having an open end, a closed end and an outside diameter, the closure comprising:
a cylindrical proximal first portion and a distal second portion, both portions being substantially congruent to a central axis thereof, the first portion having a closed end and the second portion having a hollow bore extending therethrough, the hollow bore having a distal section, a central section and a proximal section, the distal section having an open end with an inside diameter sized to accept the outside diameter of the NMR sample tube substantially without an interference, the central section being tapered and sized to provide a compliant interference fit with the outside diameter of the NMR sample tube, and the proximal section being near the proximal first portion, being tapered and being sized to accept the outside diameter of the NMR sample tube without interference.

2. The closure of claim 1, wherein as the open end of the NMR sample tube is axially inserted into the distal section of the hollow bore of the closure, the distal section guides the tube into the closure, the central section provides a user perceptible resistance to the passage of the tube and the movement of the tube open end into the proximal section allows the user to perceive a lessened resistance to the movement of the tube followed by seating the tube open end adjacent the proximal first portion of the closure.

3. The closure of claim 1, wherein the central section of the hollow bore of the distal second portion has an inside diameter sized to have an interference fit of between about 2% and about 8% relative to the outside diameter of the NMR sample tube when the closure is placed on the open end of the NMR sample tube.

4. The closure of claim 1, wherein a transition between the distal section and the central section is a ramp having a taper between about 5° and about 15°.

5. The closure of claim 1, wherein a transition between the central section and the proximal section is a ramp having a taper between about −2° and −5°.

6. The closure of claim 1, wherein the proximal first portion has a larger outside diameter than the second portion.

7. The closure of claim 6, wherein the proximal first portion and the distal second portion are a unitary article of manufacture.

8. The closure of claim 1, wherein the proximal first portion and/or the distal second portion has at least one annular groove substantially congruent to the central axis.

9. The closure of claim 1, wherein the proximal first portion and the distal second portion are individual articles of manufacture, the proximal first portion and the distal second portion being selectively attachable to each other by connectors selected from the group consisting of cooperating male and female threads, snap fit attachment means, press fit, sonic welding, spin welding, heat bonding, solvent bonding and adhesive bonding.

10. The closure of claim 9, wherein the proximal first portion further comprises a hollow passageway therethrough in communication with the hollow bore of the distal second portion when the proximal first portion and the distal second portion are attached.

11. The closure of claim 10, wherein the proximal first portion and the distal second portion further comprise a cooperating recess having a resilient septum disposed therein substantially congruently to the central axis for occluding the passageway in the proximal first portion, the septum being disposed so that a penetrating element may introduce materials to, or remove materials from, a sample tube disposed in the distal second portion through the hollow passageway in the proximal first portion.

12. The closure of claim 11, wherein an outer diameter of the proximal first portion and an outer diameter of the distal second portion cooperatively form an annular groove substantially congruent to the central axis when the proximal first portion is attached to the distal second portion.

13. A sample tube system for a NMR spectrometer, comprising:
an elongate cylinder having an open end, a closed end and substantially constant outside diameter between the open end and closed end forming a NMR vessel for containing a material therewithin, the NMR vessel being made of glass and substantially symmetrical about a central axis thereof;
a removable closure for closing the open end of the NMR vessel, the closure having a cylindrical proximal first portion and a distal second portion, both portions being substantially congruent to a central axis thereof, the distal second portion having a hollow bore extending therethrough, the hollow bore having an open distal section, a central section and a proximal section, the distal section being tapered and having an inside diameter sized to accept the outside diameter of the NMR vessel substantially without an interference, the central section being tapered and sized to provide a compliant interference fit with the outside diameter of the NMR vessel, and the proximal section sized to accept the outside diameter of the NMR vessel without interference.

14. The system of claim 13, wherein as the open end of the vessel is inserted into the hollow bore of the closure, the distal section coaxially guides the vessel into the closure, the central section provides a user perceptible resistance to the passage of the vessel and the movement of the vessel open end into the proximal section allows the user to perceive a lessened resistance of the movement of the vessel followed by disposing the vessel open end adjacent the proximal first portion of the closure, thereby substantially sealingly closing the sample tube system; and wherein the vessel and the removable closure are sized so that the vessel is positioned in the sample chamber of an NMR spectrometer when the closure has the vessel open end disposed therein and is placed in the sample chamber.

15. The sample tube system of claim 14, wherein the elongate cylinder is formed from a material selected from the group consisting of a polymeric material and a vitreous material.

16. The method of claim 15, wherein the polymeric material is placed in an automated computer numerical control lathe.

17. A method for manufacturing a closure, comprising:
   selecting a polymeric material in the form of an elongate cylinder;
   placing the elongate cylinder of the polymeric material in a lathe;
   shaping the elongate cylinder into a closure having a cylindrical proximal first portion and a distal second portion, both portions being substantially congruent to a central axis thereof, the second portion having a hollow bore extending therethrough, the hollow bore having a distal section, a tapered central section and a tapered proximal section, the distal section having an inside diameter sized to accept the outside diameter of a NMR sample tube sample tube made of glass having an open end, a closed end and a substantially constant outside diameter between the open end and closed end substantially without an interference, the central section sized to provide a compliant interference fit with the outside diameter of the NMR sample tube, and the proximal section sized to accept the outside diameter of the NMR sample tube without interference, wherein the central section of the hollow bore has a length that is at least about 35% of a length of the distal section of the hollow bore; and
   removing the finished closure from the lathe.

18. The method of claim 17, wherein the polymeric material comprises PTFE.

19. A sample tube system for a NMR spectrometer, comprising:
   an NMR vessel and a selectively removable closure;
   wherein the NMR vessel comprises an elongate cylinder having an open end, a closed end and an outside diameter forming a NMR vessel made of glass for containing a material therewithin, the NMR vessel being substantially symmetrical about a central axis thereof, wherein the elongate cylinder has a reduced outside diameter portion disposed adjacent the open end of the cylinder at a distance to cooperate with the closure when the closure is closingly disposed on the open end of the cylinder; and
   wherein the selectively removable closure for closing the open end of the cylinder, the closure having a cylindrical proximal first portion and a distal second portion, both portions being substantially congruent to a central axis thereof, the distal second portion having a hollow bore extending therethrough, the hollow bore having a distal section, a central section and a proximal section, the distal section having an inside diameter sized to accept the outside diameter of the NMR vessel substantially without an interference, the central section being tapered and sized to provide a compliant interference fit with the outside diameter of the NMR vessel at the reduced O.D. portion, and the proximal section being tapered and sized to accept the outside diameter of the NMR vessel substantially without interference, so that as the open end of the NMR vessel is inserted into the hollow bore of the closure, the distal section coaxially guides the NMR vessel into the closure, the central section provides a user perceptible resistance to the passage of the NMR vessel into the closure, and as the open end of the NMR vessel moves into the proximal section of the hollow bore and the central section of the hollow bore moves to the reduced O.D. portion of the NMR vessel, a lessened resistance of the movement of the tube is perceived followed by disposing the open end of the NMR vessel adjacent the first portion of the closure, thereby substantially sealingly closing the sample tube system at the cooperative engagement of the central section and the reduced O.D. portion; and
   wherein the NMR vessel and the removable closure are sized so that the NMR vessel is positioned in the sample chamber of the NMR spectrometer when the closure has the open end of the NMR vessel seated therein and is placed in the sample chamber.

* * * * *